United States Patent
Adachi et al.

(10) Patent No.: US 6,846,696 B2
(45) Date of Patent: Jan. 25, 2005

(54) METHOD FOR MANUFACTURING SOLAR BATTERY

(75) Inventors: Hiroki Adachi, Kanagawa (JP); Kazuo Nishi, Kanagawa (JP); Masato Yonezawa, Kanagawa (JP); Yukihiro Isobe, Yamanashi (JP); Hisato Shinohara, Kanagawa (JP)

(73) Assignees: Semiconductor Energy Laboratory Co., Ltd., Kanagawa-ken (JP); TDK Corporation, Tokyo (JP)

( * ) Notice: Subject to any disclaimer, the term of this patent is extended or adjusted under 35 U.S.C. 154(b) by 64 days.

(21) Appl. No.: 10/151,300

(22) Filed: May 21, 2002

(65) Prior Publication Data

US 2003/0017641 A1 Jan. 23, 2003

(30) Foreign Application Priority Data

May 22, 2001 (JP) ........................................ 2001-152033

(51) Int. Cl.[7] ........................ H01L 31/042; H01L 31/18; H01L 21/77
(52) U.S. Cl. ........................ 438/80; 136/244; 136/256; 136/252; 257/443; 257/431; 257/621; 438/73; 438/114; 438/461; 438/462; 438/463
(58) Field of Search ............................... 136/244, 256, 136/252; 257/443, 431, 621; 438/80, 73, 114, 461, 462, 463

(56) References Cited

U.S. PATENT DOCUMENTS

| | | | | |
|---|---|---|---|---|
| 4,292,092 A | * | 9/1981 | Hanak | 438/74 |
| 4,981,525 A | * | 1/1991 | Kiyama et al. | 136/244 |
| 5,296,043 A | * | 3/1994 | Kawakami et al. | 136/244 |
| 5,821,597 A | | 10/1998 | Nakajima et al. | |
| 6,225,552 B1 | | 5/2001 | Nishi et al. | |
| 6,455,347 B1 | * | 9/2002 | Hiraishi et al. | 438/80 |
| 2003/0041893 A1 | * | 3/2003 | Shimakawa et al. | 136/244 |
| 2003/0121542 A1 | * | 7/2003 | Harneit et al. | 136/244 |

\* cited by examiner

*Primary Examiner*—Alan Diamond
(74) *Attorney, Agent, or Firm*—Nixon Peabody LLP; Jeffrey L. Costellia (57) ABSTRACT

The invention is aimed to prevent that fall of characteristic of a solar battery and producing yield caused by particles of powder condition generating from working part at laser beam process in the method producing the solar battery by laser beam process. The constitution of the invention is characterized by comprising: a first step forming the lower electrode and the semiconductor layer on the insulating substrate by laminating; a second step forming a protective film on surface of the semiconductor; a third step forming an opening portion at the semiconductor layer, or the semiconductor layer and the lower electrode by laser beam process after the second step; and a fourth step removing the protective film.

20 Claims, 7 Drawing Sheets

PRIOR ART

Fig. 3A Transmissivity at a part not forming a protective film

Fig. 3B Transmissivity at a part forming and peeling a protective film

Fig. 3C Reflectance at a part not forming a protective film

Fig. 3D Reflectance at a part forming and peeling a protective film

Fig. 4A Output characteristic of a part not forming a protective film.

Fig. 4B Output characteristic of a part forming and peeling a protective film

Fig. 5A Spectral characteristic of a part not forming a protective film.

Fig. 5B Spectral characteristic of a part forming and peeling a protective film.

Fig. 7A Histgrams of Fill Factor as product characteristic in a case not having a protective film.

Fig. 7B Histgrams of Fill Factor as product characteristic in a case having a protective film.

METHOD FOR MANUFACTURING SOLAR BATTERY

BACKGROUND OF THE INVENTION

The present invention relates to a method for producing a solar battery having semiconductor film on insulating substrate, particularly to a method for producing an integrated solar battery produced using laser beam processing.

In recent years, a thin film solar battery in which non-monocrystal silicon film is formed on an insulating substrate is getting attention. Here, the substance applied as non-monocrystal silicon is amorphous silicon, microcrystal silicon, thin film polycrystal silicon, and compound thereof. A thin film solar battery is characterized in that production cost is kept low and material used for production is little. By using plastic film substrate having flexibility as an insulation substrate, shape of the solar battery is set freely. It is one of important characteristics to make an integrated structure possible on the insulation substrate, where desired voltage is obtained by dividing an element to plural elements on single substrate and connecting the elements in series. It is possible to use a substrate having an insulating surface, for example a conductive substrate on which an insulating film is provided.

Laser beam process is used widely for producing a solar battery of integrated structure. The laser beam process irradiates laser beam gathered on a certain area to a work piece, makes a hole by melting, evaporation, or scattering, performs melting, cutting off, and marking, and divides, thereby any shape can be processed by scanning laser beam. By this technique, separation of thin film can be performed with scribing width of equivalent width in high speed. The laser beam process is used even for means melting and connecting taking-out electrodes of the solar battery. Although the process is called bonding especially, the process is included in the laser beam process.

There has been technique of photolithography hitherto as a method for shape-processing pattern for the purpose of electrode and semiconductor layer constituting solar battery. Patterning process of the solar battery using the photolithography applies a resist to allover face of the work piece, exposes through a mask, and after that, a resist mask is formed at developing process. Next, area except masked area with the resist is etched by etching process, after that, the resist is peeled off by alkali solvent, and cleaning and drying are performed, thereby the process is completed. The process has problems of complexity and many process steps, long processing time, and high production cost.

The patterning process of the solar battery by laser beam process is simple and few in number of processes. It has a distinguishing characteristic that the processes are completed only by irradiating laser beam while scanning at a part desired to perform patterning.

The laser beam process irradiates laser beam, melts a part of work instantly, and evaporates or scatters. At this time, material of the part of work melted at high temperature is cooled while scattering or after sticking at periphery, and becomes particles of powder condition. The particles of powder condition damage generating layer of the solar battery at manufacturing process after the laser beam process, thereby causes one of decline in characteristic.

Figure 2A:
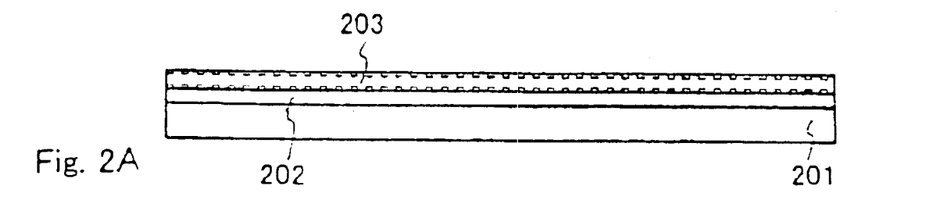
FIGS. 2A to 2E are views describing process producing a solar battery using laser beam processing method of the related art.
Figure 2B:
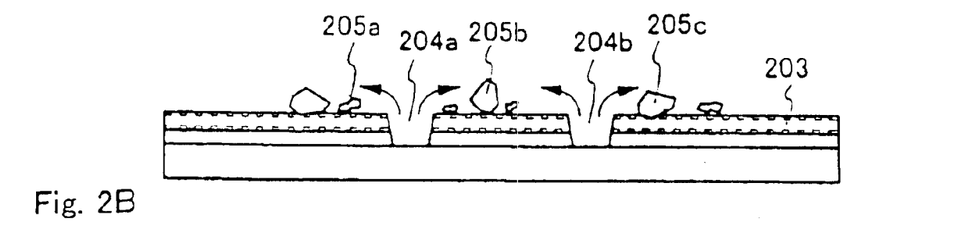

Here, producing process of the solar battery using laser beam process of the prior art will be described using FIGS. 2A to 2E. First, a lower electrode 202 is formed on a substrate 201, and on the lower electrode 202, a semiconductor layer 203 being a generating of the solar battery is formed as shown in FIG. 2A. Next, to make an integrated structure of the solar battery on the same substrate, the lower electrode layer and the semiconductor layer are divided by laser beam process, and plural sections are made. Divided parts 204a and 204b by laser beam process are shown in FIG. 2B. At the laser beam process, the semiconductor layer and the lower electrode of the divided portions are melted and scattered by the laser beam. Particles 205a, 205b, and 205c of powder condition generated at this time scatter and stick on the semiconductor layer 203 of periphery. The particles possibly get stuck in the semiconductor layer 203.

Figure 2C:
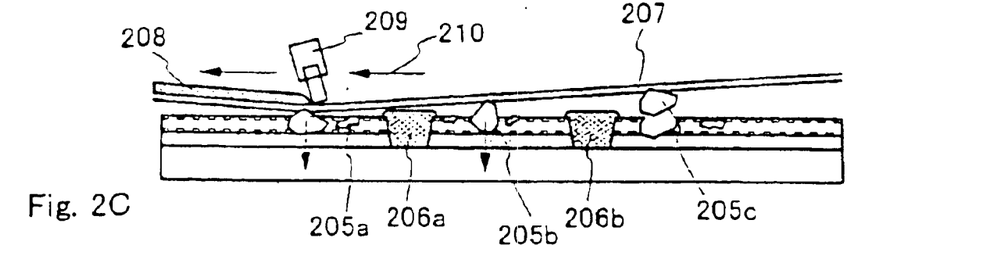

After the laser beam process, insulating layers 206a and 206b are formed. This is because contact of the lower electrode and an upper electrode is prevented when the conductive upper electrode is formed on the divided portion. The state using thermosetting resin as insulating layer and forming with screen printing method is shown in FIG. 2C. Insulating thermosetting resin 208 is applied on a screen printing plate 207, a squeegee 209 is moved to direction 210 from right to left of the figure, and resin is printed at parts of the insulation layers 206a and 206b. At the printing, the screen-printing plate 207 contacts the semiconductor layer 203 and particles of powder condition, and presses the particles of powder condition against the semiconductor layer. Even the particles of powder condition stuck on surface of the semiconductor layer are possibly taken in the semiconductor layer.

Figure 2D:
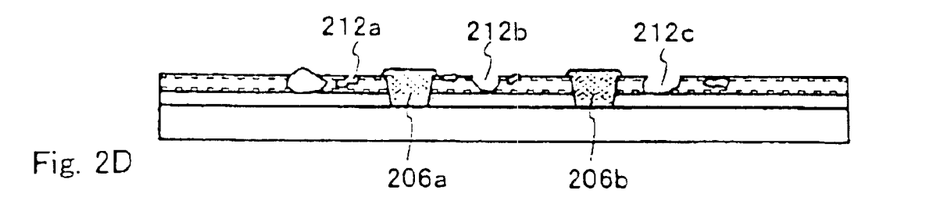

In the printing process, when the screen-printing plate is separated from the semiconductor layer and further after the printing process, particles of powder condition possibly desorbs from surface of semiconductor layer or inside. Parts 212a, 212b, and 212c where the particles of powder condition are desorbed exist at the semiconductor layer as shown in FIG. 2D.

Figure 2E:
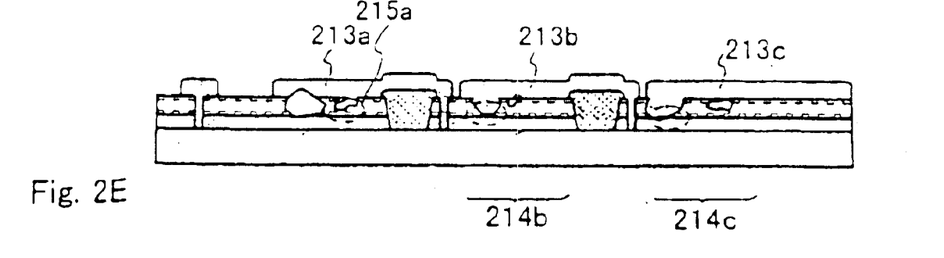

Although the upper electrodes 213a, 213b, and 213c are formed as shown in FIG. 2E after the printing process and drying process, at this time, parts 215b and 215c where the upper electrode and the lower electrode contact are formed at parts 212b and 212c where the lower electrodes expose among the desorbed parts 212a, 212b, and 212c. Since the upper electrode and the lower electrode contact at unit cells 214b and 214c, characteristic of the solar battery such as release voltage decreases. At a part 212a where the lower electrode is not exposed, a part 215a where the upper electrode and the lower electrode are close is formed. Although characteristic of the solar battery such as release voltage does not decrease directly by cause of the close part 215a, damage caused by static electricity occurs easily at dealing as a product.

Although method forming insulation layer using screen printing method is described in FIGS. 2A to 2E, in the case forming insulation layer by another method or using another producing process of the solar battery, generation of the particles of powder condition can not be avoided as long as the laser beam process is performed. Although particles of powder condition generated at laser beam process stick at semiconductor layer and get in inside of the layer, the particles drop out by process forming the upper electrode, and the upper electrode contacts the lower electrode at forming the upper electrode.

As one means to reduce foreign bodies of fine particles, there is a method adjusting condition of laser power, that is, feeding speed of a part of work in laser beam processing device. For example, means making laser power weak, that is, making feeding speed of the working portion fast may be used. However, particles of powder condition generated at laser beam process can reduce using the means, however, it is impossible to remove the entire particles. For example, although it is possible to make the sizes small or to reduce numbers of particles of powder condition 205a, 205b, and 205c shown in FIG. 2B, it is impossible to remove the entire particles.

As another means to reduce foreign bodies of fine particles, a method absorbing particles of power condition generated at process in laser beam processing device using absorbing mechanism. However, although material of a part processed by laser melts and scatters instantly, scattering speed is considerably high and temperature is high. Because of that, removing the particles of powder condition before adhesion to generating layer of the solar battery or removing the particles of powder condition stuck is not performed completely even by using strong absorbing mechanism.

The invention is performed in view of the above-mentioned problem, an object of the invention is to prevent decrease of characteristic of the solar battery and production yield caused by particles of powder condition generating from a part of work at laser beam process.

SUMMARY OF THE INVENTION

In order to solve the above-mentioned problem, the constitution of the invention is characterized by comprising: a first step forming the lower electrode and the semiconductor layer on the insulating substrate by laminating; a second step forming a protective film on surface of the semiconductor; a third step forming an opening portion at the semiconductor layer, or the semiconductor layer and the lower electrode by laser beam process after the second step; and a fourth step removing the protective film.

Another constitution is characterized by comprising: a first step forming the lower electrode and the semiconductor layer on the insulating substrate by laminating; a second step forming a protective film providing an opening portion on surface of the semiconductor by screen-printing method; a third step forming an opening portion at the semiconductor layer, or the semiconductor layer and the lower electrode by laser beam process corresponding to the opening portion; and a fourth step removing the protective film.

Although the protective film is formed of thermosetting resin, it is desirable to form the protective film with thermosetting polyester system resin. The protective film can be removed without complex process by peeling an adhesive tape and the protective film at the same time after the adhesive tape is bonded to the protective film.

By providing the protective film at laser beam process, particles of powder condition generating from a part of work is prevented to stick directly at the semiconductor layer so that the semiconductor is prevented to damage. By removing the protective film after laser beam process, particles of powder condition gets in the inside of the semiconductor layer and drops out by the forming process of the upper electrode even at screen-printing process so that shortage of the lower electrode at forming the upper electrode is prevented.

DETAILED DESCRIPTION OF PREFERRED EMBODIMENTS

Figure 1A:
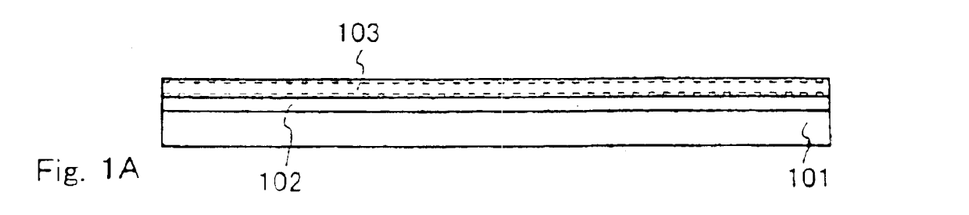
FIGS. 1A to 1E are views describing process producing a solar battery using protective film at laser beam process.
Figure 1B:
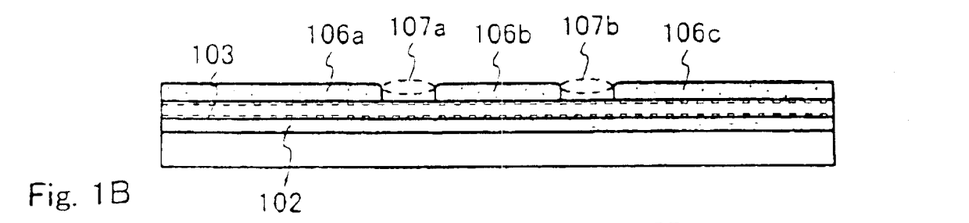

A mode for carrying out the invention will be described referring FIGS. 1A to 1E. First, a lower electrode 102 and a semiconductor layer 103 are formed on a substrate 101 as shown in FIG. 1A. Next, protective films 106a, 106b, and 106c are formed except places 107a and 107b where laser beam process is performed as shown in FIG. 1B. For the protective films, thermosetting resin, for example, is printed using screen-printing method so as to form by thermosetting.

Figure 1C:
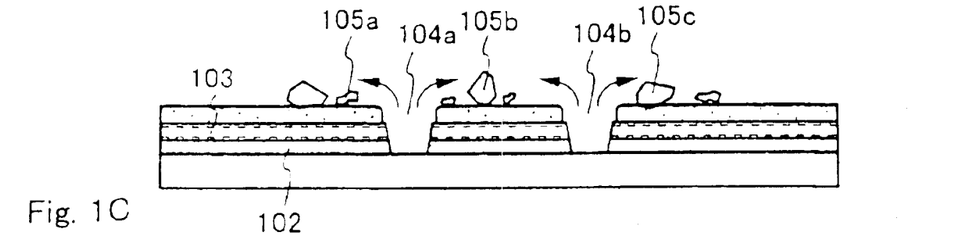

After forming the protective film, laser beam process is performed to divide the semiconductor layer 103 and the lower electrode 102 as shown in FIG. 1C. Divided portions 104a and 104b of the semiconductor layer and the lower electrode are formed by laser beam process. At laser beam process, particles of powder condition 105a, 105b, and 105c melted from the semiconductor layer 103 and the lower electrode 102 by laser beam scatter and stick on protective films 106a, 106b, and 106c.

Figure 1D:
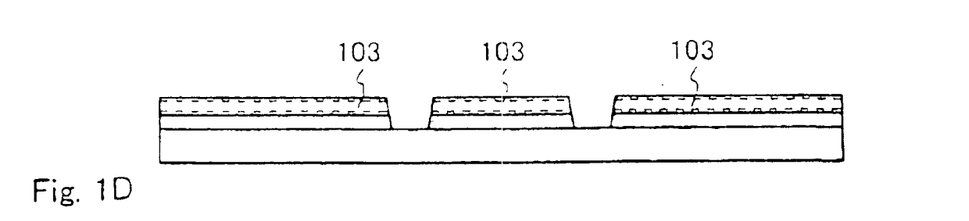

After the laser beam process, the protective films 106a, 106b, and 106c are removed as shown in FIG. 1D. Although melting by organic solvent is general in removing method of resin, it is difficult to melt only the protective film selectively at producing process when another resin is already formed on surface of substrate. On the other hand, when thermosetting resin having elasticity easy in exfoliation is used for the protective film, only protective film can be removed easily without crush by method that adhesive tape is put on surface of the substrate and is peeled off, that is, peeling method. Such the peeling method without using solvent can omit washing process, and can reduce process. Because the protective film and particles of powder condition stuck on the protective film are removed at the same time, particles of powder condition on the semiconductor layer 103 become nothing at all.

Figure 1E:
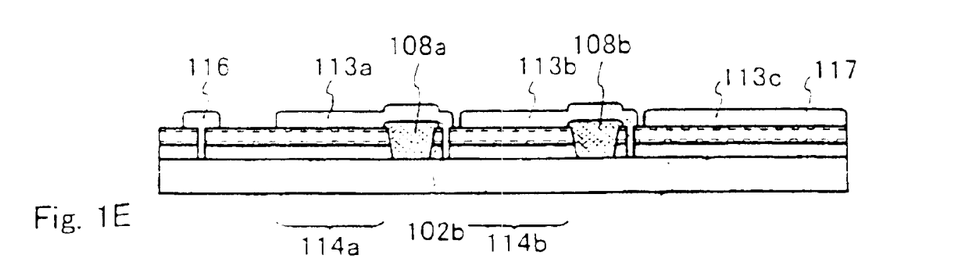

After removing the protective films, divided portions of the semiconductor layer and the lower electrode are filled with insulators 108a and 108b as shown in FIG. 1E. The insulators are formed of thermosetting insulating resin, for example, using screen-printing method. Further upper electrodes 113a, 113b, and 113c are formed to become a laminated structure. For example, the upper electrode 113a of a unit cell 114a connects to the lower electrode 102b of a unit cell 114b, and each unit cell is connected in series. The upper electrodes are formed of conductive resin, for example, using screen-printing method. At the same time, an ejecting electrode 116 of the lower electrode side and an ejecting electrode 117 of the upper electrode side are formed. When process forming the protective films is used, contact of the semiconductor and the lower electrode is not generated at forming the upper electrode because the semiconductor does not have parts where particles of powder condition are omitted. Characteristic of the solar battery does not fall, and yield of product improves.

Embodiments

Embodiment 1

In the embodiment, existence of influence to output characteristic of the solar battery by forming and peeling the protective film is shown. First, a translucent lower electrode and a non-monocrystal silicon layer are formed on a translucent substrate, and at a part on the non-monocrystal silicon layer, protective films protecting the non-monocrystal silicon layer from particles of powder condition generating at laser beam process are formed. For the protective films, thermosetting resin of polyester system (STRIP MASK #228-T made by Asahi chemical laboratory, Inc.) is used. After forming the protective films, the protective films are peeled by an adhesive tape after designated time.

Figure 3A:
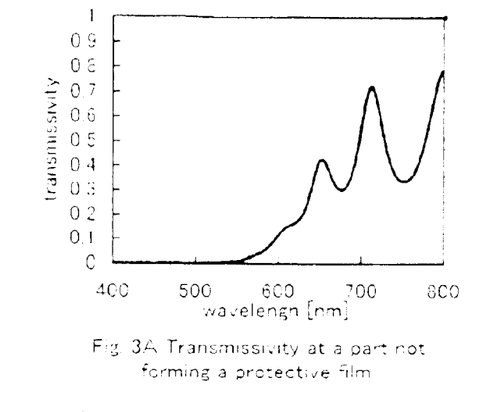
FIGS. 3A to 3D are graphs showing transmissivity and reflectance as influence to monocrystal silicon film by protective film.
Figure 3B:
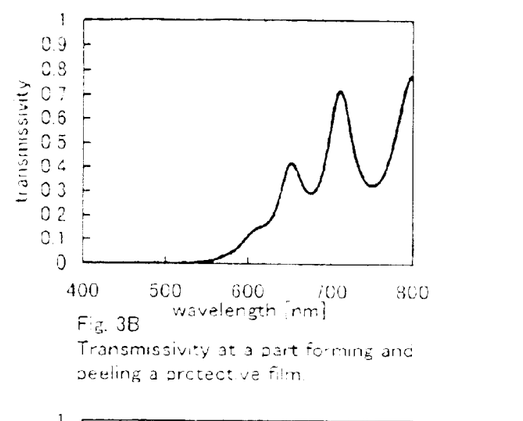
Figure 3C:
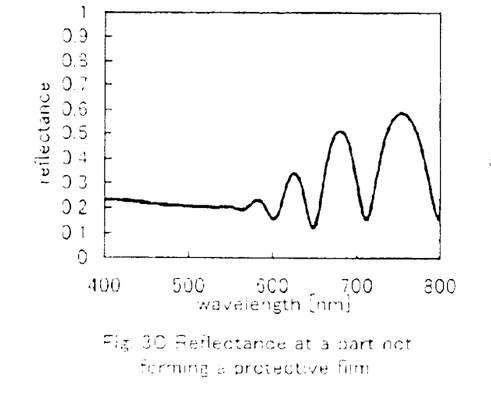
Figure 3D:
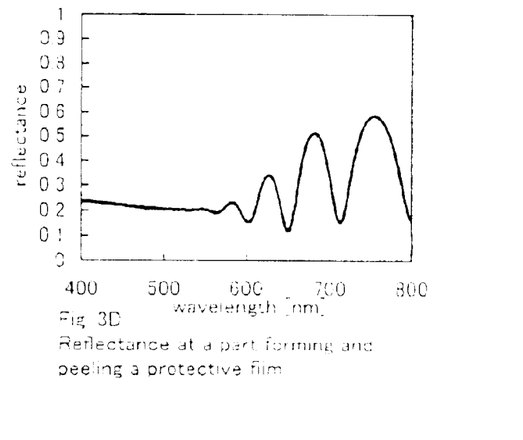

After the process peeling the protective films, a part not forming the protective films and a part forming and peeling the protective films exist, then, transmissivity and reflectance are measured at each part. Transmissivity at the part not forming the protective films is shown in FIG. 3A, transmissivity at the part forming and peeling the protective films is shown in FIG. 3B, reflectance at the part not forming the protective films is shown in FIG. 3C, and reflectance at the part forming and peeling the protective films is shown in FIG. 3D. In transmissivity and reflectance, there is not difference between the part not forming the protective films and the part forming and peeling the protective films.

Figure 4A:
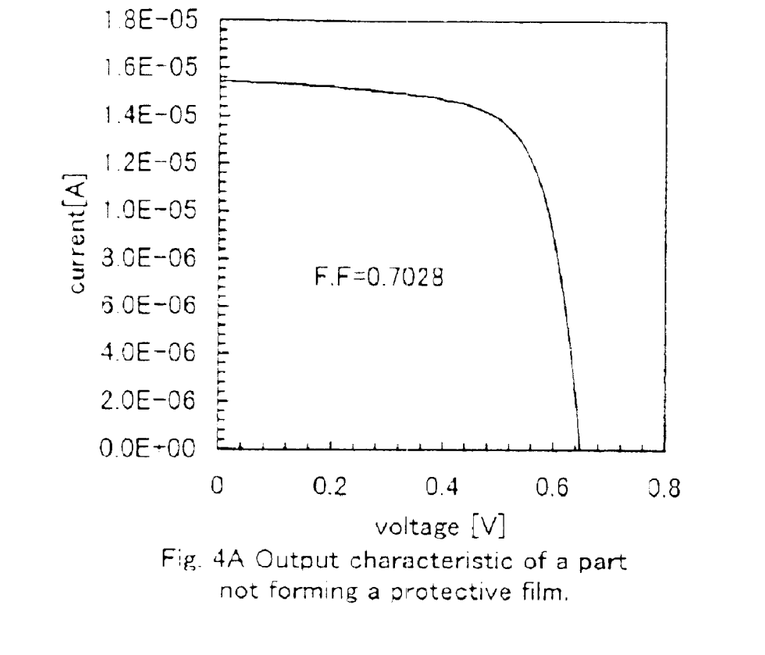
FIGS. 4A and 4B are graphs showing output characteristic of solar battery as influence to monocrystal silicon film by protective film.
Figure 4B:
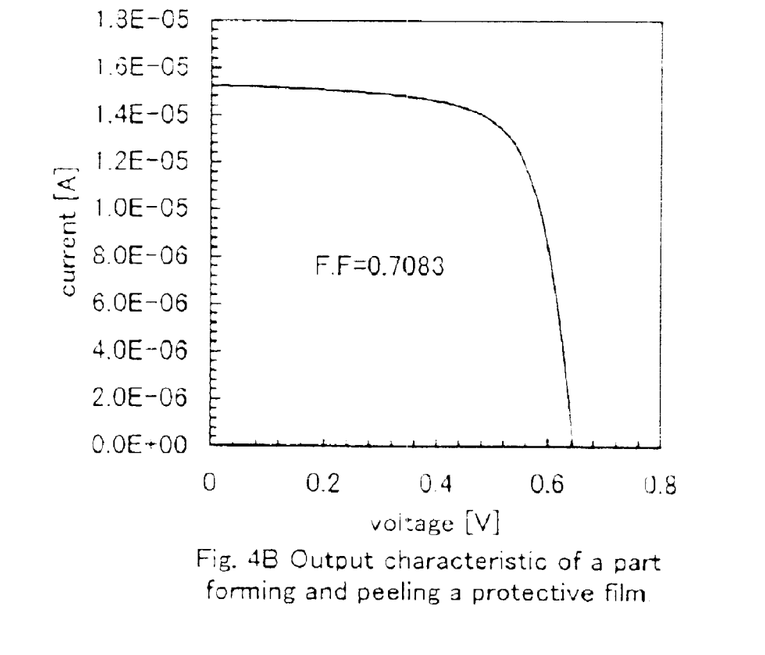
Figure 5A:
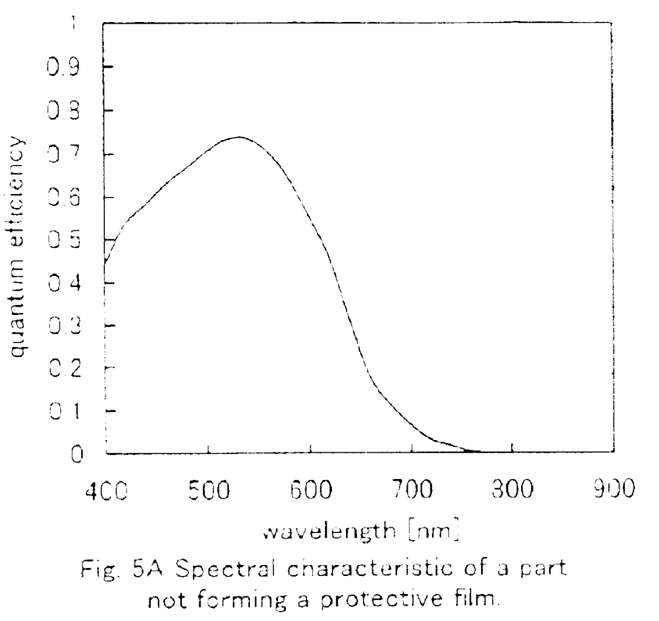
FIGS. 5A and 5B are graphs showing spectral characteristic as influence to monocrystal silicon film by protective film.
Figure 5B:
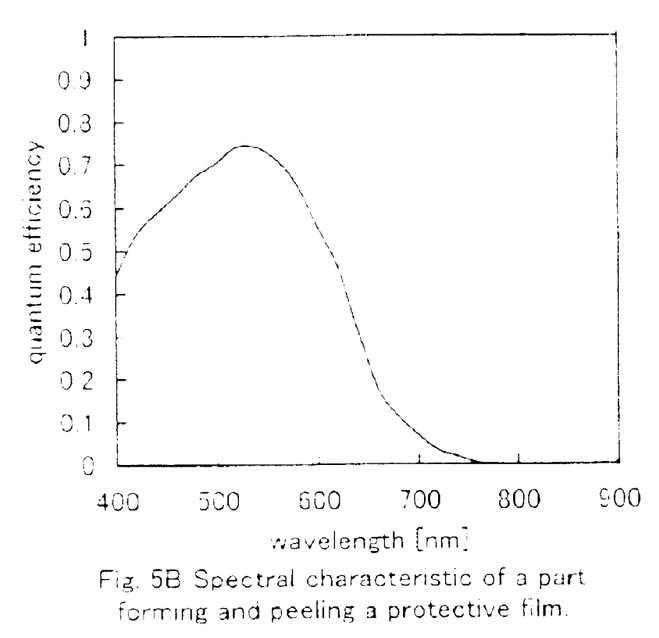

After the process peeling the protective films, an upper electrode is formed at each of the part not forming the protective films and the part forming and peeling the protective films to form the solar battery. After that, output characteristic of each solar battery is measured to compare the characteristic. Output characteristic (I-V characteristic) of each solar battery is shown in FIGS. 4A and 4B, and spectral characteristic of each solar battery is shown in FIGS. 5A and 5B. Even in output characteristic and spectral characteristic of each solar battery, there is not difference between the part not forming the protective films and the part forming and peeling the protective films.

By the experimentation, it is known that forming and peeling the protective films on the non-monocrystal silicon layer does not influence output characteristic of the solar battery produced using the non-polycrystal silicon layer. The similar effect can be obtained even at another process producing the solar battery.

Embodiment 2

In the embodiment, a non-monocrystal silicon solar battery of a laminated structure is produced on an elastic substrate, and comparison of yield of final product is shown. Producing processes are shown in FIGS. 6A to 6E. First, ITO (Indium tin oxide) and GZO (Gallium addition zinc oxide) are filmed as translucent conductive material on translucent PEN (Polyethylene naphthalate) film substrate by spattering method to form a lower electrode. Thickness of the ITO layer and the GZO are set to 50 to 60 nm and 20 to 30 nm respectively. Non-monocrystal silicon layers of each of conductive types of p, i, and n are coated to form a generating layer of the solar battery. Thickness of the non-monocrystal silicon layers is set to 300 to 800 nm, in the embodiment, 600 nm.

Next, the non-monocrystal silicon film and the lower electrode layer are divided in order to form the laminating structure on the same substrate, and one unit of the solar battery is produced. The one unit of the solar unit means a part having one stage of pin junction. Although there is a case including conductive ejecting electrode in the pin junction, in the embodiment, the one unit of the solar battery is called unit cell. Protective films are formed in order to protect the generating layer of the solar battery from particles of powder condition.

Figure 6A:
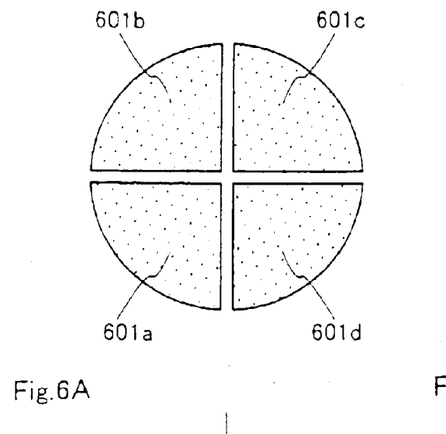
FIGS. 6A to 6E are views describing process producing a solar battery using protective film.

A state forming protective films 601a, 601b, 601c, and 601d on the generating layer are formed is shown in FIG. 6A. In FIG. 6A, periphery of the protective films shows the lower electrode portion and the generating layer portion. Thermosetting resin easy in peeling is used for the protective films to form using screen-printing method. In the embodiment, STRIP MASK #228-T made by Asahi chemical laboratory, Inc. is used for the thermosetting resin.

Figure 6B:
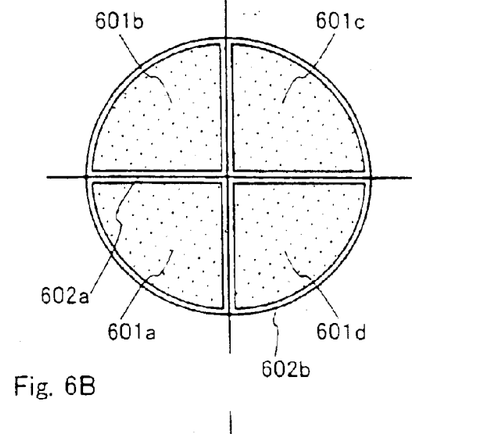

After forming the protective films, the protective films are divided using laser beam process as shown in FIG. 6B. The method dividing with laser beam is called laser scribing. A divided portion 602a is divided to each unit cell, and a divided portion 602b is divided to the periphery portion and an external form of the solar battery. It is need to consider the following items for dimension design of space between the divided portion and the protective film. Actual width of made by laser beam process is about 0.1 mm. The width varies a little by kind of film processed, laser power, and processing speed. Margin of alignment shift at laser beam process is considered. Therefore, distance between protective films provided at both side of the divided portion by the laser beam process is need to set 0.2 mm or more at least. In the case forming the protective film using thermosetting resin by screen-printing method, design of a screen-printing plate considering the dimension is need. Since the object of the protective film is to prevent damage of the generating layer caused by particles of powder condition, it is desirable to cover the generating layer part as far as possible and to make space between the divided portion and the protective film by laser beam process as small as possible. In the embodiment, distance between protecting films provided at both sides of the divided portion by laser beam process is set to 0.5 mm.

Figure 6C:
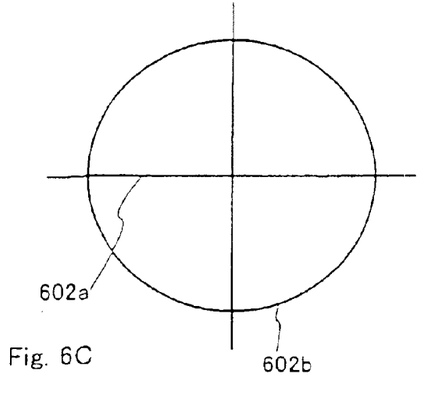

After the laser beam process, the protective films are peeled as shown in FIG. 6C. In the peeling process, a tape having stronger adhesion than adhesion of the protective films to the generating layer is put, and the tape and the protective films are peeled at the same time.

Figure 6D:
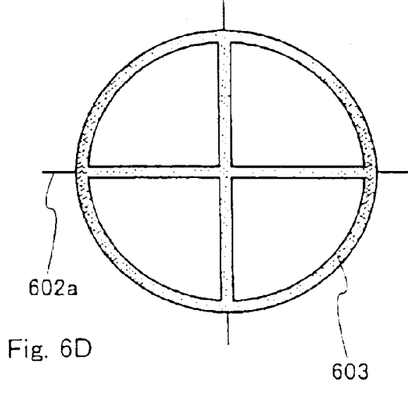

The divided portions 602a and 602b are filled with insulating resin 603 as shown in FIG. 6D. The reason is as the following. That is, when the upper electrode of the unit cell is formed so as to get over the divided portion to connect to the lower electrode of adjacent unit cell, it is prevented to contact the lower electrode of the upper electrode itself so that output falls. Insulating resin is formed using thermosetting resin by screen-printing method.

Figure 6E:
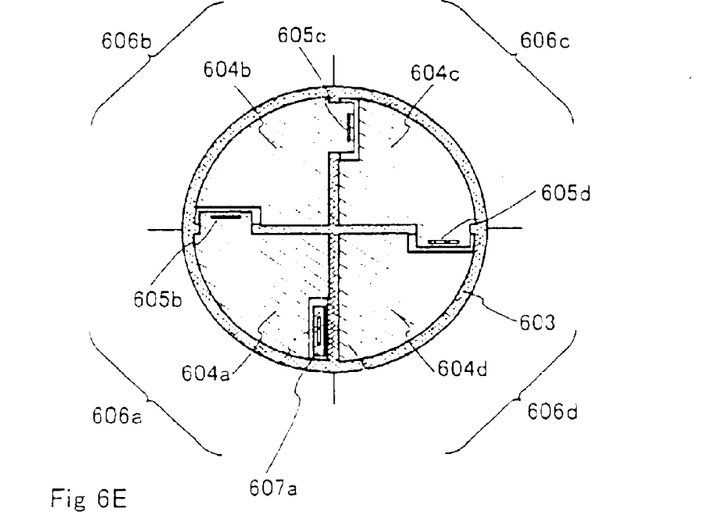

After forming the insulating resin, conductive upper electrodes 604a, 604b, 604c, and 604d are formed as shown in FIG. 6E. The conductive upper electrode is formed using thermosetting resin containing silver or carbon by screen-printing method. The upper electrode are connected to the lower electrodes of the unit cell adjacent to laser-bonding portions 605b, 605c, and 605d. For example, the upper electrode 604a of a unit cell 606a is connected to the lower electrode of adjacent unit cell 606b at the laser-bonding portion 605b. A rejecting electrode 607a is connected to the lower electrode of the unit cell 606a by laser bonding, is ejected to upper side. After the laser bonding process, unit cells 606a, 606b, 606c, and 606d are laminated in series, and a solar battery having an ejecting electrode 607a of the lower electrode side and an ejecting electrode 607b of the upper electrode side electrode is completed. By forming the protective films protecting the generating layer of the solar battery at laser beam process, damage of the generating layer by particles of powder condition can be prevented. The solar battery shows excellent characteristic, and production yield of characteristic improves.

Figure 7A:
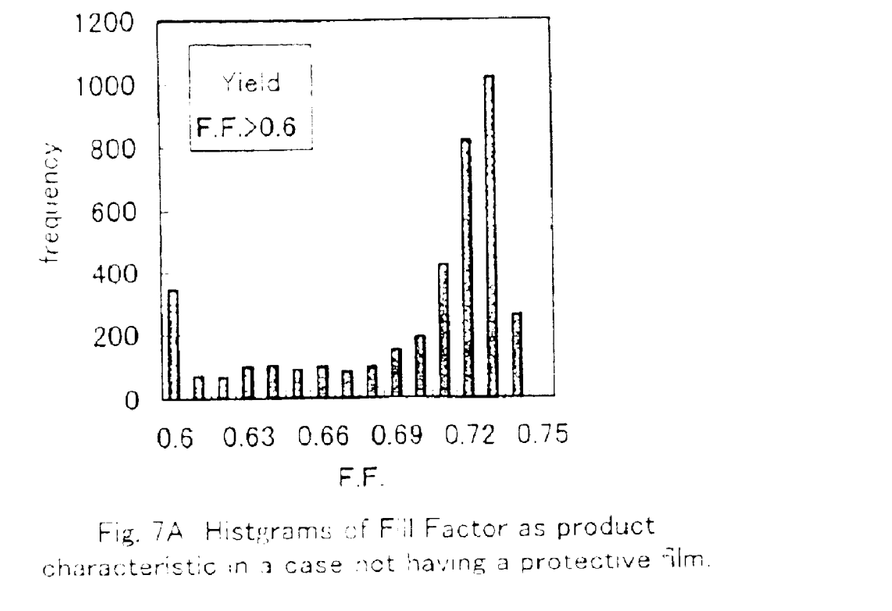
FIGS. 7A and 7B are histograms showing comparison of production characteristic by existence of protective film.
Figure 7B:
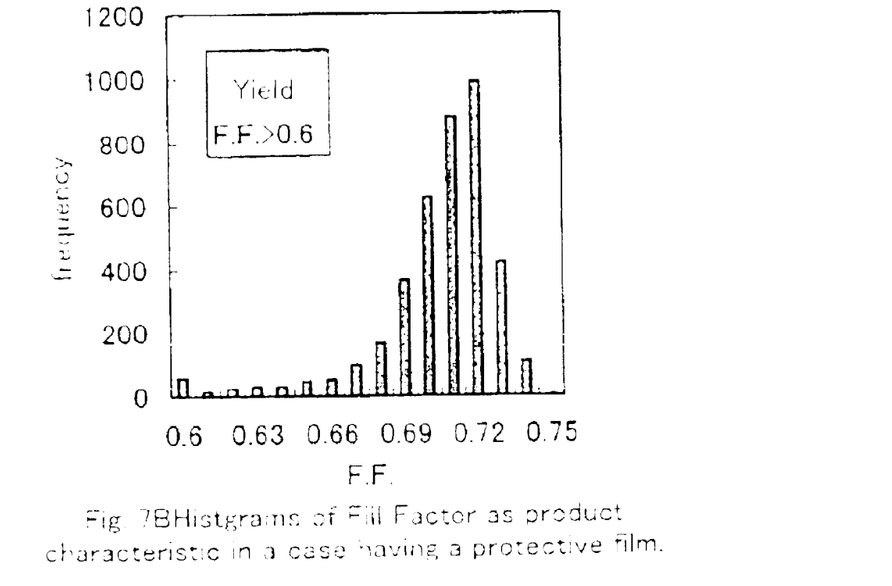

Histograms of Fill Factor (F.F) as product characteristic by existence of the protective film of resin are shown in FIGS. 7A and 7B. FIG. 7A shows in the case not having the protective film, and FIG. 7B shows the case having the protective film. Yield is defined as that F.F is larger than 0.65 at characteristic of the solar battery of low illuminance 200 lux. Although characteristic of the solar battery does not almost change as shown in Embodiment 1, it is shown that effect of the protective films appears largely in yield.

There is the following characteristic when screen-printing on the protective film is possible and thermosetting resin easy in peeling is used. First, the resin has viscosity enabling to perform screen-printing process similarly as another thermosetting resin, and the desired shape can be obtained by pattern hole plate. Because drying (curing) temperature is low, it is hard to generate damage to another film and change in quality of material by temperature. Cure of the resin is performed by volatizing solvent component at low temperature baking of some degree. The cured resin is peeled with simple contact. For example, an adhesive tape is used. Since adhesion of the resin and face of the protective film is weak, damage does not appear at surface of the protective film so that peeling is possible. At this time, since resin has flexibility, resin itself is not crushed at peeling operation of the resin, and new fine particles are not increased. Like this, since thermosetting resin easy in peeling is possible to perform the similar screen-printing as usual printing process and is removed easily at peeling process, it is possible to use as mask material of various uses. The present invention can be applied to not only the solar battery but also other photovoltaic devices and semiconductor devices.

As described above, particles of powder condition generated from working part can be removed easily at laser beam process by using the present invention in patterning process of the solar battery by laser beam process. In producing process after laser beam process, characteristic can be improved without damage of the generating layer of the solar battery. Further, in product, product yield of characteristic can be improved.

What is claimed is:

1. A method for manufacturing a solar battery laminating a lower electrode, a semiconductor layer and an upper electrode on an insulating substrate in order, comprising:
    forming the lower electrode and the semiconductor layer on the insulating substrate by laminating, the semiconductor layer having a lower surface on the lower electrode and an upper surface;
    forming a protective film on and in direct contact with the upper surface of the semiconductor layer;
    forming an opening portion at the semiconductor layer, or the semiconductor layer and the lower electrode by laser beam process;
    removing the protective film; and
    after removing the protective film, forming the upper electrode on the semiconductor layer and the lower electrode.

2. A method for manufacturing a solar battery according to claim 1, wherein the protective film is formed of thermosetting resin.

3. A method for manufacturing a solar battery according to claim 1, wherein the protective film is formed of thermosetting polyester resin.

4. A method for manufacturing a solar battery according to claim 1, wherein an adhesive tape is bonded to the protective film and the adhesive tape and the protective film are peeled at the same time.

5. A method for manufacturing a solar battery laminating a lower electrode, a semiconductor layer and an upper electrode on an insulating substrate in order, comprising:
    forming the lower electrode and the semiconductor layer on the insulating substrate by laminating, the semiconductor layer having a lower surface on the lower electrode and an upper surface;
    forming a protective film providing a first opening portion on and in direct contact with the upper surface of the semiconductor by screen-printing method;
    forming a second opening portion at the semiconductor layer, or the semiconductor layer and the lower electrode by laser beam process corresponding to the second opening portion; and
    removing the protective film.

6. A method for manufacturing a solar battery according to claim 5, wherein the protective film is formed of thermosetting resin.

7. A method for manufacturing a solar battery according to claim 5, wherein the protective film is formed of thermosetting polyester resin.

8. A method for manufacturing a solar battery according to claim 5, wherein an adhesive tape is bonded to the protective film and the adhesive tape and the protective film are peeled at the same time.

9. A method for manufacturing a device, comprising:
    forming a lower electrode and a semiconductor layer on an insulating surface by laminating, the semiconductor layer having a lower surface on the lower electrode and an upper surface;
    forming a protective film on and in direct contact with the upper surface of the semiconductor layer;
    forming an opening portion at the semiconductor layer, or the semiconductor layer and the lower electrode by laser beam process;
    removing the protective film; and
    after removing the protective film, forming the upper electrode on the semiconductor layer and the lower electrode.

10. A method for manufacturing a device according to claim 9, wherein the protective film is formed of thermosetting resin.

11. A method for manufacturing a device according to claim 9, wherein the protective film is formed of thermosetting polyester resin.

12. A method for manufacturing a device according to claim 9, wherein an adhesive tape is bonded to the protective film and the adhesive tape and the protective film are peeled at the same time.

13. A method for manufacturing a device, comprising:
    forming a lower electrode and a semiconductor layer on an insulating surface by laminating, the semiconductor layer having a lower surface on the lower electrode and an upper surface;
    forming a protective film providing a first opening portion on and in direct contact with the upper surface of the semiconductor by screen-printing method;
    forming a second opening portion at the semiconductor layer, or the semiconductor layer and the lower electrode by laser beam process corresponding to the second opening portion; and
    removing the protective film.

14. A method for manufacturing a device according to claim 13, wherein the protective film is formed of thermosetting resin.

15. A method for manufacturing a device according to claim 13, wherein the protective film is formed of thermosetting polyester resin.

16. A method for manufacturing a device according to claim 13, wherein an adhesive tape is bonded to the protective film and the adhesive tape and the protective film are peeled at the same time.

17. A method for manufacturing a device comprising:

forming a lower electrode on a insulating surface;

forming a semiconductor layer on the lower electrode;

forming a protective film on a surface of the semiconductor layer;

forming an opening portion at the semiconductor layer and the lower electrode by laser beam;

exposing the surface of the semiconductor layer by removing the protective film; and after removing the protective film, forming the upper electrode on the semiconductor layer and the lower electrode.

18. A method for manufacturing a device according to claim 17, wherein the protective film comprises thermosetting resin.

19. A method for manufacturing a device according to claim 17, wherein the protective film comprises thermosetting polyester resin.

20. A method for manufacturing a device according to claim 17, wherein an adhesive tape is bonded to the protective film and the adhesive tape and the protective film are peeled at the same time.

* * * * *